(12) United States Patent
Ohtsu et al.

(10) Patent No.: US 9,224,665 B2
(45) Date of Patent: Dec. 29, 2015

(54) SEMICONDUCTOR DEVICE AND METHOD FOR PRODUCING THE SAME

(75) Inventors: Kenji Ohtsu, Aichi (JP); Yoshiji Ohtsu, legal representative, Aichi (JP); Taku Kusunoki, Tokyo (JP); Takeshi Araki, Tokyo (JP); Hiroaki Tatsumi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 14/233,252

(22) PCT Filed: Jul. 6, 2012

(86) PCT No.: PCT/JP2012/067314
§ 371 (c)(1),
(2), (4) Date: Jan. 16, 2014

(87) PCT Pub. No.: WO2013/018504
PCT Pub. Date: Feb. 7, 2013

(65) Prior Publication Data
US 2014/0138710 A1  May 22, 2014

(30) Foreign Application Priority Data
Aug. 4, 2011  (JP) ................... 2011-170793

(51) Int. Cl.
*H01L 23/48* (2006.01)
*H01L 23/14* (2006.01)
(Continued)

(52) U.S. Cl.
CPC ............ *H01L 23/14* (2013.01); *H01L 23/3735* (2013.01); *H01L 24/83* (2013.01); *H01L 24/89* (2013.01); *H01L 23/498* (2013.01); *H01L 24/05* (2013.01); *H01L 24/29* (2013.01);
(Continued)

(58) Field of Classification Search
CPC .......................... H01L 23/3735; H01L 23/498
USPC ........................ 257/734, 737; 438/106, 107
See application file for complete search history.

(56) References Cited

U.S. PATENT DOCUMENTS

2011/0070695 A1* 3/2011 Bayerer ................. H01L 24/78
438/107
2011/0114706 A1  5/2011 Sasaoka et al.
(Continued)

FOREIGN PATENT DOCUMENTS

JP        8 102570      4/1996
WO    2009 157160   12/2009

OTHER PUBLICATIONS

International Search Report Issued Oct. 9, 2012 in PCT/JP12/067314 Filed Jul. 6, 2012.

*Primary Examiner* — David Vu
*Assistant Examiner* — Brandon Fox
(74) *Attorney, Agent, or Firm* — Oblon, McClelland, Maier & Neustadt, L.L.P.

(57) ABSTRACT

A semiconductor device includes a circuit substrate which is configured with an insulative substrate formed of a ceramic material and provided on its one surface with an electrode formed of a copper material, and a power semiconductor element bonded with the electrode using a sinterable silver-particle bonding material, wherein the electrode has a Vickers hardness of 70 HV or more in its portion from the bonding face with the power semiconductor element toward the insulative substrate to a depth of 50 μm, and has a Vickers hardness of 50 HV or less in its portion at the side toward the insulative substrate.

20 Claims, 4 Drawing Sheets

(51) Int. Cl.
*H01L 23/373* (2006.01)
*H01L 23/498* (2006.01)
*H01L 23/00* (2006.01)

(52) U.S. Cl.
CPC ........ *H01L 24/32* (2013.01); *H01L 2224/0345* (2013.01); *H01L 2224/04026* (2013.01); *H01L 2224/05082* (2013.01); *H01L 2224/05155* (2013.01); *H01L 2224/05644* (2013.01); *H01L 2224/05655* (2013.01); *H01L 2224/06181* (2013.01); *H01L 2224/29294* (2013.01); *H01L 2224/29339* (2013.01); *H01L 2224/32225* (2013.01); *H01L 2224/32245* (2013.01); *H01L 2224/73263* (2013.01); *H01L 2224/8384* (2013.01); *H01L 2224/83192* (2013.01); *H01L 2224/83447* (2013.01); *H01L 2224/92246* (2013.01); *H01L 2924/01029* (2013.01); *H01L 2924/1033* (2013.01); *H01L 2924/10253* (2013.01); *H01L 2924/10254* (2013.01); *H01L 2924/10272* (2013.01); *H01L 2924/10329* (2013.01); *H01L 2924/1305* (2013.01); *H01L 2924/1306* (2013.01); *H01L 2924/13055* (2013.01); *H01L 2924/13091* (2013.01); *H01L 2924/15747* (2013.01); *H01L 2924/15787* (2013.01)

(56) References Cited

U.S. PATENT DOCUMENTS

| | | | |
|---|---|---|---|
| 2011/0186999 A1* | 8/2011 | Momose et al. | 257/741 |
| 2013/0175690 A1* | 7/2013 | Fuchs | H01L 23/498 257/751 |
| 2013/0328204 A1* | 12/2013 | Zommer | B23K 1/20 257/765 |

* cited by examiner

SEMICONDUCTOR DEVICE AND METHOD FOR PRODUCING THE SAME

TECHNICAL FIELD

The present invention relates to a semiconductor device using a circuit substrate on which a semiconductor element operable at a high temperature is mounted, and a method for fabricating the same.

BACKGROUND ART

As a substrate for mounting a silicon power semiconductor element, there is known as shown in Patent Document 1, for example, a circuit substrate which comprises a ceramic substrate formed of an aluminum nitride sintered member, a silicon nitride sintered member or the like, and a metal plate made of copper, a copper alloy or the like, bonded with the ceramic substrate by brazing. In Patent Document 1, the metal plate after the bonding is made to have a Vickers hardness of 60 or more, in order to prevent a crack from occurring in the ceramic substrate due to a difference in thermal expansion between the substrate and the metal plate.

Power semiconductor elements such as switching elements (IGBT, MOSFET, etc.,) and rectifier elements, that are used for power semiconductor devices, such as inverters, are required to reduce their power losses. Thus, there have recently been developed power semiconductor elements using wide bandgap semiconductors, such as silicon carbide (SiC) and gallium nitride, etc. In the case of the wide bandgap semiconductor element, since this element has itself a higher thermal resistance, it is operable at a high temperature with a large current; however, in order to exert such a feature, it is required that the power semiconductor element and the circuit substrate be tightly bonded together.

Using a solder or a brazing material for this bonding as a bonding material, requires a higher temperature for bonding than the operation temperature of the element, and is, therefore, difficult to be applied to the power semiconductor device which uses a wide bandgap semiconductor and is supposed to operate at a high temperature. As a result, metal-nanoparticles, which can be sintered at a temperature lower than the melting point of the corresponding bulk metal and are tolerable up to the melting point of the bulk metal after sintering, is becoming adopted as a bonding material for high temperature operation use. For example, in Patent Document 2, there is disclosed that metal nanoparticles of gold, silver, copper or the like, with a size of 50 nm or less are used when a SiC semiconductor is bonded with an electrode on a substrate.

CITATION LIST

Patent Document

Patent Document 1: Japanese Patent Application Laid-open No. H08-102570 (Paragraphs 0026 to 0042, FIG. 1, FIG. 2)
Patent Document 2: International Publication No. WO2009/157160A1 (Paragraphs 0038 to 0050, FIG. 1, FIG. 2)

SUMMARY OF THE INVENTION

Problems to be Solved by the Invention

When considering high temperature operation due to large current of the power semiconductor element using a wide bandgap semiconductor, it is suitable to use a thick copper member as the electrode to be formed on the circuit substrate. Further, it is suitable to bond the copper member and the semiconductor element together by silver, using silver nanoparticles, as the bonding material. In the course of conducting study in these points of view, it has been found that the adhesiveness due to the silver bonding, determined by a thermal cycle test, depends on the hardness of the electrode of the circuit substrate. Further, in the case of the electrode formed by bonding a thick copper plate with the circuit substrate as shown in Patent Document 1, it was not able to keep a hardness that had been found to be necessary by the inventors because of decrease in hardness of copper, to thereby cause variation in bonding strength. Thus, it was not able to achieve highly reliable bonding and thus, a long life and highly reliable power semiconductor device.

This invention has been made to solve the problem as described above, and an object thereof is to provide a semiconductor device which can keep bonding state with the semiconductor element over a long period, even operating at a high temperature.

Means for Solving the Problems

A semiconductor device according to the invention is characterized by it comprising: a circuit substrate which comprises an insulative substrate formed of a ceramic material and provided on its one surface with an electrode formed of a copper material; and a semiconductor element bonded with the electrode using a sinterable silver-particle bonding material; wherein the electrode has a Vickers hardness of 70 HV or more in its portion from a bonding surface with the semiconductor element toward the insulative substrate to a depth of 50 μm, and has a Vickers hardness of 50 HV or less in its another portion at the side toward the insulative substrate.

Effect of the Invention

According to this invention, since the electrode is made to have a Vickers hardness of 70 HV or more in its portion from the bonding surface with the semiconductor element to a predetermined depth, and to have a Vickers hardness of 50 HV or less in its another portion at the side toward the insulative substrate, it becomes possible to achieve a semiconductor device which can keep bonding state of the semiconductor element and the circuit substrate, over a long period even operating at a high temperature.

MODES FOR CARRYING OUT THE INVENTION

Embodiment 1

Figure 1:
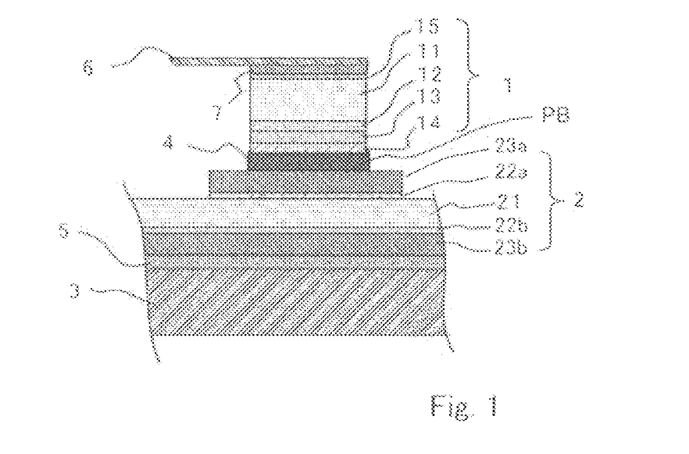
FIG. 1 is a partial cross-sectional view for illustrating a configuration of a power semiconductor device according to Embodiment 1 of the invention.
Figure 2:
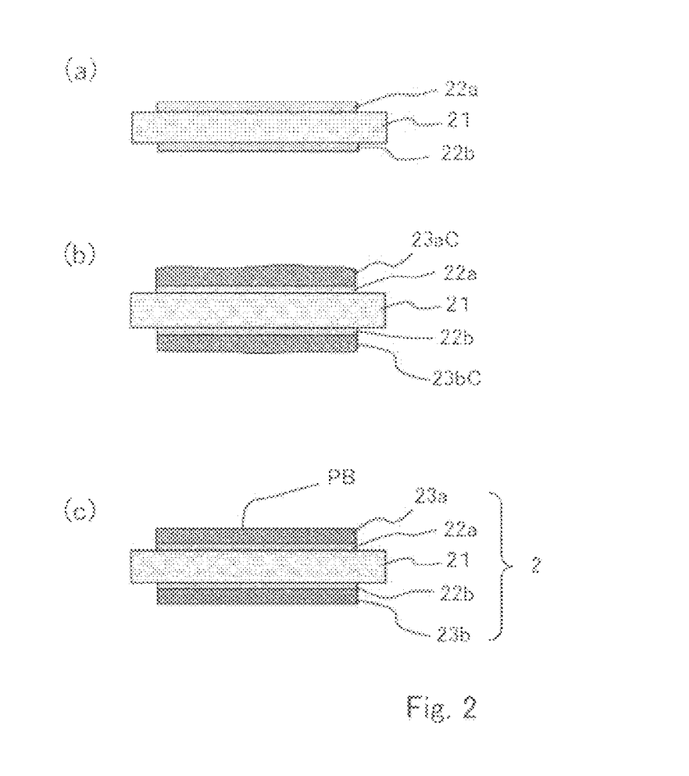
FIG. 2 is cross-sectional views for illustrating a method for fabricating a circuit substrate, according to Embodiment 1 of the invention.
Figure 3:
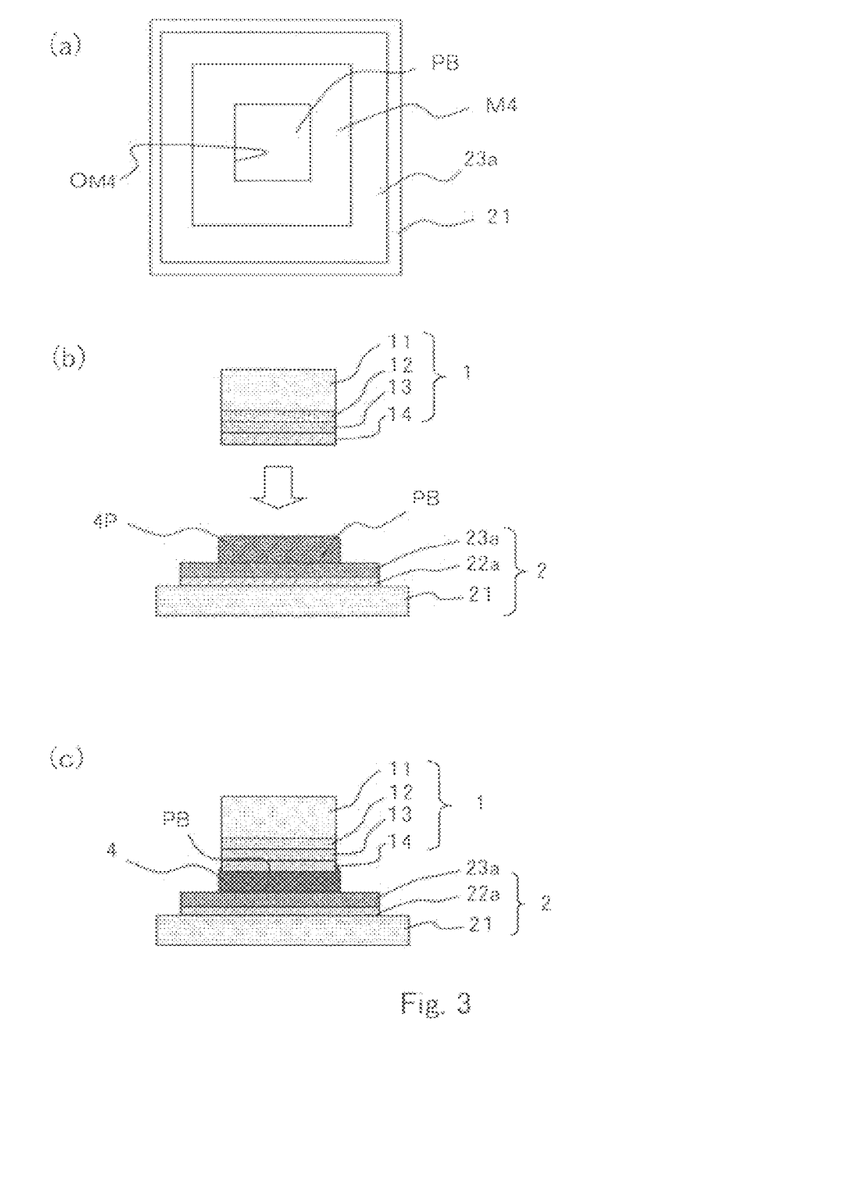
FIG. 3 is cross-sectional views for illustrating a method for fabricating the power semiconductor device, according to Embodiment 1 of the invention.
Figure 4:
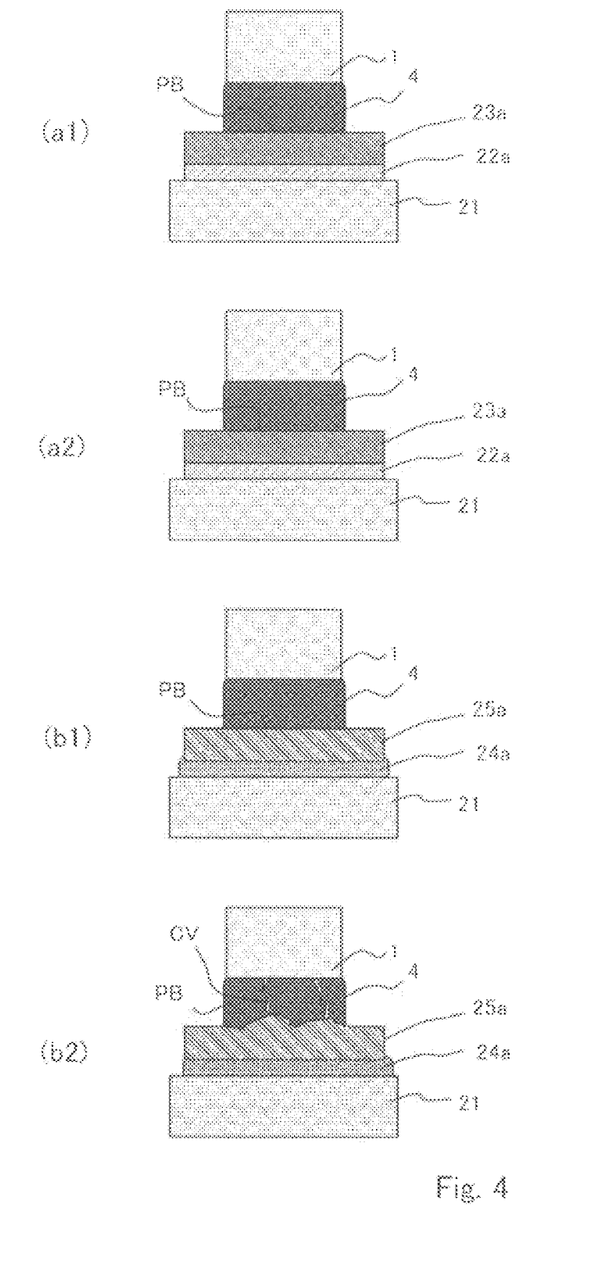
FIG. 4 is diagrams for illustrating bonding reliability of the power semiconductor device according to Embodiment 1 of the invention, in which states of cross-sections before and after a life test are shown for each of Example and Comparative Example.
Figure 5:
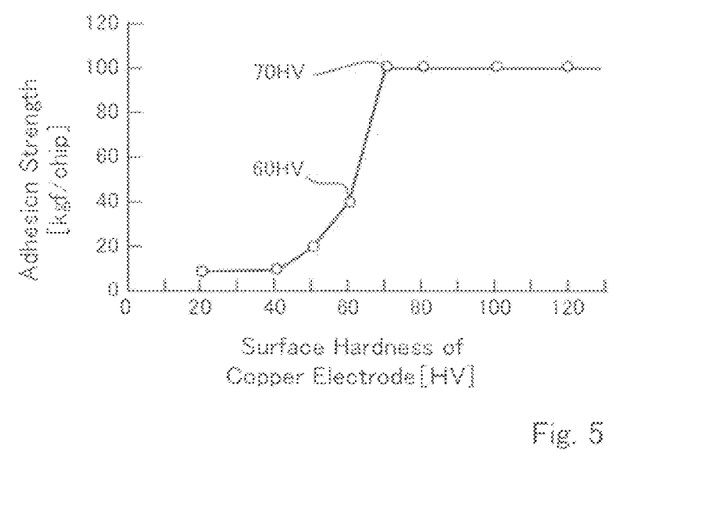
FIG. 5 is a diagram for illustrating bonding reliability of the power semiconductor device according to Embodiment 1 of the invention, in which a relationship between the surface hardness of a copper electrode and the adhesion strength is shown.

A power semiconductor device and a circuit substrate used for the power semiconductor device according to Embodiment 1 of the invention will be described based on the drawings. FIG. 1 to FIG. 5 are for illustrating the power semiconductor device and the circuit substrate according to Embodiment 1 of the invention. Of these, FIG. 1 is a partial cross-sectional view of the power semiconductor device and FIG. 2 is for illustrating a method for fabricating the circuit substrate, in which cross-sections in respective steps are shown at FIG. 2(*a*) to FIG. 2(*c*). FIG. 3 is for illustrating how to bond a power semiconductor element with the circuit substrate in the method for fabricating the power semiconductor device, in which respective states in this step are shown at FIG. 3(*a*) to FIG. 3(*c*), as a top face at FIG. 3(*a*) and cross-sections at FIG. 3(*b*) and FIG. 3(*c*). Further, FIG. 4 is for illustrating bonding reliability of the power semiconductor device according to this embodiment, in which shown at FIG. 4(*a*1) and FIG. 4(*a*2) are respective cross-sectional views of a bonded product of a circuit substrate and a semiconductor element fabricated as Example, before and after a life test, and shown at FIG. 4(*b*1) and FIG. 4(*b*2) are respective cross-sectional views of a bonded product of a circuit substrate and a semiconductor element fabricated as Comparative Example, before and after the life test. Also, FIG. 5 is for illustrating bonding reliability of the power semiconductor device according to this embodiment, which is a graph showing a relationship between the surface hardness of a copper electrode and its adhesion strength.

As shown in FIG. 1, in the power semiconductor device according to Embodiment 1, a base plate 3 is bonded with one surface of a circuit substrate 2, and a power semiconductor element 1 is bonded with the other surface thereof, and further, a lead plate 6 is bonded with the power semiconductor element 1 on its side opposite to a bonding surface PB with the circuit substrate 2. In the figure, portions of both end sides of each of the circuit substrate 2 and the base plate 3, and a portion of one end side of the lead plate 6, are omitted from illustration. Details will be described below.

<Semiconductor Element>

A power semiconductor element and a control semiconductor device are fundamentally the same-type semiconductor elements. However, in the case of the power semiconductor element, in order to pass a main current, that is, a large current to flow, its circuit substrate is required to have a different specification (electrode conductivity and heat dissipation property). This causes a problem as described in BACKGROUND ART. Accordingly, in each embodiment of the invention, a power semiconductor element for controlling main power is used as a semiconductor element.

The power semiconductor element 1 is configured by laminating a metal silicide 12, a first metal layer (Ni) 13 and a second metal layer (Au) 14 in this order, on one surface of a semiconductor chip (semiconductor substrate) 11. Further, on the other surface, a metal film 15 of nickel (Ni), gold (Au) or the like is formed. Used as the power semiconductor element 1 is that having the substrate of, for example, silicon carbide which is a wide bandgap semiconductor material, with a thickness of 500 μm. Applicable as the power semiconductor element 1 are a diode serving as a rectifier element, an IGBT (Insulated Gate Bipolar Transistor) serving as a switching element, or the like, and the metal layers may be formed into a given circuit pattern. The semiconductor material and the structure and material of the metal layers are not limited to these, and the size of the power semiconductor element 1 is also not limited specifically and may be adjusted appropriately. However, as described later, a wide bandgap semiconductor capable of handling a large current and operating at a high temperature, is exemplified as a preferable choice for the power semiconductor device according to this embodiment to exert its effect.

<Circuit Substrate>

The circuit substrate 2, which is an electrode-attached insulative substrate, is configured by laminating sputtered films (Cu) 22*a*,22*b* (collectively referred to as a metal thin film 22) and plating electrodes (Cu) 23*a*,23*b* (collectively referred to as a copper plating electrode 23) each having a thickness of 500 μm, in this order, respectively on both surfaces of an insulative substrate (silicon nitride) 21. The copper plating electrode 23, whose preferable thickness range is each from 150 μm to 500 μm, is each set to be 500 μm in this embodiment, in which at least the copper plating electrode 23*a* at the side of the bonding surface PB with the power semiconductor element 1 is made to have a Vickers hardness of 70 HV or more. Meanwhile, in the circuit substrate 2, not only silicon nitride but also alumina, aluminum nitride or the like may be used for the insulative substrate 21. In view of heat dissipation from the overall power semiconductor device that generates large amount of heat, it is desirable to use a material having a thermal conductivity of 20 W/m·K, and is more desirable to use that having a thermal conductivity of 70 W/m·K or more.

<Bonding Material>

The power semiconductor element 1 and the circuit substrate 2 are bonded together by a sintered silver bonding layer 4. The sintered silver bonding layer 4 is formed by heating a sinterable silver-particle bonding material (silver nanopaste), which has been made into a paste by suspending silver particles in a organic base, so as to be sintered at a temperature lower than the melting point of silver by causing mutual contact between surfaces of the silver particles having been covered with the organic substance.

<Power Semiconductor Device>

After bonding the power semiconductor element 1 with one surface of the circuit substrate 2 (at the side of 23*a*, in the figure) by using the silver nanopaste, the base plate (Cu etc.,) 3 is bonded with the plating electrode (Cu) 23*b* on the other surface of the substrate (at the side of 23*b*, in the same) by using a bonding material 5 such as a solder. Further, the lead plate 6 is bonded with the metal film 15 (element electrode) formed on the surface (active surface) opposite to the surface of the power semiconductor element 1 facing the circuit substrate 2, using a bonding material 7 such as a solder, so that a power semiconductor device is completed in terms of electrical connections. Thereafter, the device is subjected to packaging with a resin or the like, by a generally used sealing technique.

Next, a method for fabricating the power semiconductor element 1 will be briefly described. A silicon carbide substrate 11 having a diameter of several inches is prepared. On at least one surface of the silicon carbide substrate 11, for the purpose of bonding it with the lead plate 6 that makes an electrical connection to the outside, the metal film 15 of nickel, gold or the like serving as an element electrode, is formed by a publicly known method such as sputtering. Although the thickness of the metal film 15 to be formed is not specifically limited and may be adjusted appropriately in conformity to the size of the power semiconductor element to be fabricated, it is typically from 10 nm to 2000 nm or less. Note that the metal film 15 is unnecessary for describing how to bond with the circuit substrate 2, so that its illustration will be omitted in the later figures.

Then, a nickel layer having a thickness of 50 nm, as a metal layer for forming the metal silicide 12, is formed on the surface of the silicon carbide substrate 11 at the side opposite to the surface on which the metal film 15 is formed, namely, on the surface at the side to be bonded with the circuit substrate 2, which is then subjected to heat treatment for one hour at 800° C. under vacuum atmosphere, to thereby develop a nickel silicide layer having a thickness of around 50 nm as the metal silicide 12. Further, using a sputtering method, a nickel layer having a thickness of 200 nm is formed as the first metal layer 13 on the surface of the metal silicide 12, and a gold layer having a thickness of 200 nm is formed as the second metal layer 14 on the surface of the nickel layer, serially. Thereafter, it is subjected to dicing so as to be cut into a size of 5.0 mm square, and the cut piece after washing is used as the power semiconductor element 1.

A method for fabricating the circuit substrate 2 will be described using FIG. 2. As shown at FIG. 2(a), the metal thin film 22 having a thickness of 200 nm is formed by sputtering processing in respective areas of 18 mm square (18 mm×18 mm) on both surfaces of the insulative substrate 21 having a size of 20 mm square (20 mm×20 mm), a thickness of 1.0 mm and made of silicon nitride. Then, as shown at FIG. 2(b), on the thus-formed metal thin film 22, copper plating layers 23aC and 23bC (collectively referred to as a copper plating layer 23C) each having a thickness of about 600 μm are formed. Forming the copper plating layer 23C to be thick, generally causes unevenness in thickness. Thus, as shown at FIG. 2(c), its surface is subjected to mechanical polishing to thereby form the copper plating electrode 23 having a uniform thickness of 500 μm.

The thickness of the copper plating electrode 23 is preferably in a range from 150 μm to 500 μm. By ensuring the thickness of the copper plating electrode 23 (exactly, the thickness as the conductive member) to be 150 μm or more, it is possible to dissipate efficiently heat generated due to the large current. Although the thickness may be more than 500 μm from the functional viewpoint, in the case where all portions of the thickness are formed by plating as in this embodiment, it is desirable to keep it within 500 μm from the viewpoints in relation to its material, its forming steps and the like. Further, in the copper plating electrode 23, at least the portion of the copper plating electrode 23a, which serves as an electrode to be bonded with the power semiconductor element 1 by the sintered silver bonding layer 4, is required to ensure a hardness of 70 HV or more. Note that the hardness of the copper plating electrode 23a is not necessarily uniform in thickness direction and over all layers therein; however, its portion corresponding to the thickness of 50 μm or more at the side near the power semiconductor element 1 is required to ensure a hardness of 70 HV or more. Further, as described later, although the hardness of 70 HV or more is sufficient in actual effect, it is desirable to have a margin to thereby ensure the hardness to be 100 HV or more from the viewpoint of the fabrication accuracy.

As the plating bath for forming the copper plating layer 23C, a high-throw bath composed of copper sulfate and sulfuric acid and having a PH of 1.0 was used. Then, using a DC power source (Hokuto Denko Corporation; Electrochemical Measurement System HZ-5000), the copper plating layer 23C was formed by a constant-current electrolysis under a condition with a current density of 1.0 A/dm$^2$ and a bath temperature of 25° C. Note that it is desirable to add to the plating solution a hardening agent, such as a thiourea derivative, in order to enhance the hardness of the copper plating layer 23C. Not only the above-described plating bath that achieves a hardness of 70 HV or more, but also a plating bath of copper pyrophosphate, copper borofluoride and/or copper cyanide may be used.

A method for bonding the power semiconductor element 1 with the circuit substrate 2 formed as described above, will be described using FIG. 3. Note that, in the figure, portions in the circuit substrate 2 beyond the insulative substrate 21 toward the base plate 3 are omitted from illustration.

As shown at FIG. 3(a), on the surface of the copper plating electrode 23a, using a stainless mask M4 having an opening $O_{M4}$ of 6 mm square and a thickness of 0.2 mm, a silver nanopaste 4P which is a sinterable silver-particle bonding material was printed in the portion within the opening $O_{M4}$. Then, as shown at FIG. 3(b), the power semiconductor element was positioned with and mounted on the surface of thus-printed silver nanopaste 4P, to provide a provisional bonded product. Subsequently, the provisional bonded product was subjected to a pre-heat treatment at 100° C. for 10 minutes, and was then heated to 350° C. while being pressed at 5 MPa. After reaching 350° C., the product was retained for 5 minutes, so that the organic substance having covered the silver nanoparticles (fine particles) included in the silver nanopaste was decomposed, and the fine particles thus-exposed were sintered together, to thereby form the sintered silver bonding layer 4 as shown at FIG. 3(c). Then, it was air-cooled, to thereby achieve a bonded product of the circuit substrate 2 and the power semiconductor element 1. Thereafter, by further bonding the base plate 3 and the lead plate 6 with the product as previously-mentioned, it is possible to achieve the power semiconductor device. As the silver nanopaste 4P, T2W-A2 made by DOWA corporation may be used, for example. The above heat-bonding was carried out using a bonding apparatus (Athlete FA Corporation; thermal compression bonding unit).

Next, in order to evaluate bonding reliability between the power semiconductor element 1 and the circuit substrate 2 in the power semiconductor device according to Embodiment 1 of the invention, a comparative test was conducted using samples (Example) of the bonded products according to this embodiment and other samples (Comparative Example) of the bonded products corresponding to a conventional circuit substrate.

<Samples for Comparison>

The samples (bonded products) of Comparative Example were prepared by the following manner.

Its semiconductor element was fabricated by the same method as for the power semiconductor device 1 used in Embodiment 1. As shown at FIG. 4(b1), used as the circuit substrate was an insulative substrate 21 having a size of 20 mm square and a thickness of 1.0 mm, made of silicon nitride, and provided with copper plates 25 each having a size of 18 mm square and a thickness of 500 μm which were bonded by a brazing material 24 respectively with both surfaces of the insulative substrate 21 (Like FIG. 3, portions placed at the side opposite to the side of the bonding surface PB with the power semiconductor element are omitted from illustration). The bonding method (fabrication method of the bonded product) was similar to that in Embodiment 1. Herein prepared respectively were three samples of Example (SE1-1 to SE1-3), and three samples of Comparative Example (SC1-1 to SC1-3).

<Comparative Test of Adhesion Strength>

The samples of bonded products thus-configured were put in a heat-shock tester (ESPEC Corporation: Thermal Shock Chamber TSA-101S-W) and then placed in the treatment condition of from −40 C.° to 200° C. (one cycle comprises keeping −40 C.° for 30 minutes and 200 C.° for 30 minutes). For every 200 cycles, the adhesion strengths were measured by a share tester (Dage Corporation: Share Tester HS4000). In evaluating the adhesion strengths, it was determined as "no adhesion defect" if no peel-off occurred even when 30 Kgf/chip or more was applied, and determined as "reduction in strength" if peel-off occurred when less than 30 Kgf/chip was applied. Note that each surface hardness of the copper plating electrode 23a of Example and the copper plate electrode 25a of Comparative Example, was measured using a Vickers hardness tester (Mitutoyo Corporation: MVK-H2), under a condition with a measuring load of 100 g and a measuring time of 10 seconds. Before the bonding, the hardness of the copper plating electrode 23a of each sample of Example was 70 HV, whereas the hardness of the copper plate electrode 25a of each sample of Comparative Example was 30 HV.

In Table 1, the result of the comparative test of adhesion strength is shown, in which "o" represents "no adhesion defect" and "X" represents "reduction in strength".

TABLE 1

| Sample | | Spec | Adhesion Strength passing cycles without adhesion defect | | | | | |
|---|---|---|---|---|---|---|---|---|
| | | | 0 | 200 | 400 | 600 | 800 | 1000 |
| Comparative Example | SC1-1 | Copper Plate Electrode | O | X | X | X | X | X |
| | SC1-2 | Copper Plate Electrode | O | O | X | X | X | X |
| | SC1-3 | Copper Plate Electrode | O | X | X | X | X | X |
| Example | SE1-1 | Copper Plating Electrode | O | O | O | O | O | O |
| | SE1-2 | Copper Plating Electrode | O | O | O | O | O | O |
| | SE1-3 | Copper Plating Electrode | O | O | O | O | O | O |

As shown in Table 1, in the samples of Example each having the copper plating electrode 23a, even after passing 1000 cycles, there is no occurrence of adhesion defect, so that reduction in adhesion strength is not found. In contrast, in the samples of Comparative Example each having the brazed copper plate electrode 25a, it is confirmed that adhesion defect occurred before 400 cycles, so that the adhesion strength becomes reduced.

In order to compare the states of the samples of Example and the samples of Comparative Example after the comparative test of adhesion strength, their respective cross-sections were observed using a SEM (Scanning Electron Microscope (JEOL Ltd.: JXA-8530F)). At FIGS. 4(a1) and (a1), the cross-sectional states of each sample of Example before starting the cycle and after passing 1000 cycles, and at FIGS. 4(b1) and (b2), the cross-sectional states of each sample of Comparative Example before starting the cycle and after passing 400 cycles, are shown schematically. As shown at FIGS. 4(a1),(a2), according to the observation of the cross-sections of the samples of Example, no grain boundary sliding was found at the bonding surface PB of the copper plating electrode 23a bonded with the power semiconductor element 1, and also no vertical crack was found in the sintered silver bonding layer 4 serving as the bonding part. In contrast, as shown at FIGS. 4(b1),(b2), according to the observation of the cross-sections of the bonded samples of Comparative Example that showed reduction in adhesion strength after passing 400 cycles, a grain boundary sliding was found at the bonding surface PB of the copper plate electrode 25a bonded with the power semiconductor element 1, and a vertical crack CV was found developed in the sintered silver bonding layer 4 beginning at the grain boundary sliding portion.

Here, it is noted that each copper electrode of the samples of Example is the copper plating electrode 23 formed by plating, and thus does not require a heat treatment for brazing or the like, and even at the later bonding process with the power semiconductor element 1, its temperature never exceeds the usual annealing temperature for annealing copper (400° C. or more). Thus, it is possible to retain a high hardness (70 HV or more). In contrast, each copper electrode of the samples of Comparative Example is the copper plate electrode 25a by brazing, so that the hardness of the electrode surface is softened to 30 HV and the hardness seems unlikely to increase at the bonding process with the power semiconductor element 1.

Namely, it is considered that: according to the samples of Example, since the hardness of the copper electrode is high, a grain boundary sliding in the electrode by a thermal shock test is suppressed and a vertical crack in the sintered silver bonding layer 4 associated with the sliding is prevented from occurring; whereas, according to the samples of Comparative Example, since the hardness of the copper electrode is low, a grain boundary sliding can not be suppressed, so that a vertical crack associated with the grain boundary sliding occurs in the sintered silver bonding layer 4, causing reduction in adhesion strength. Namely, it is considered that the differences in adhesion strength between Example and Comparative Example are resulted from differences in hardness of the copper electrodes.

Thus, in order to verify this consideration, electrodes of the same type of plating, except for their hardness being changed, were prepared to thereby examine a relationship between the hardness and the adhesion strength.

Similarly to the samples of Example (SE1-1 to SE1-3) in the comparative test of adhesion strength, each plating electrode is formed by plating up to a thickness of about 600 μm followed by grinding it by mechanical polishing to a thickness of 500 μm. Although the hardness just after the polishing was 120 HV or more, it was adjusted to in the range of 20 to 120 HV by a pre-heat treatment under nitrogen atmosphere. Then, the power semiconductor element was bonded, similarly to the comparative test of adhesion strength, to each of the electrodes adjusted in hardness, and a thermal shock test of −40° C. to 200° C. was conducted to thereby measure each adhesion strength after passing 400 cycles.

FIG. 5 shows a relationship between the surface hardness of the copper electrode and the adhesion strength, in which the axis of abscissa and the axis of ordinate represent the surface hardness and the adhesion strength, respectively. As shown in the figure, in the range of the surface hardness of the copper electrode from 60 HV to 70 HV, the adhesion strength increases abruptly as the surface hardness increases, and at more than 70 HV, an adhesion strength of 100 Kgf/chip or more is stably shown. Namely, it was revealed that the adhesion strength depends not on the preparation method such as whether by plating or by copper-plate brazing, but on the final surface hardness of the electrode, and that a strong adhesion strength can be kept by retaining 70 HV or more. Meanwhile, it was found that, in view of manufacturing variations, the surface hardness of the plating electrode is desirably to be 100 HV or more from the aspect of ensuring a margin.

Further, an SEM observation of the crystallized state of the copper electrodes with higher adhesion strength having a hardness of 70 HV, revealed that almost all particle sizes fallen in the range of 1 to 10 μm, and their average crystal grain size was less than 10 μm. In contrast, according to the electrodes having a hardness of 30 HV or less, almost all particle size were 50 μm or more. Accordingly, when the state of the electrode is to be controlled by an average crystal grain size, it is considered that the average crystal grain size is desirably 10 μm or less. Further, since the hardness tends to increase as the average crystal grain size becomes smaller, it is considered that the average crystal grain size is more desirably 5 μm or less.

It is noted that, in Embodiment 1, the circuit substrate 2 is described for the case of having the copper plating electrodes 23a,23b formed on both surfaces thereof; however, it is not limited to the case. When the surface necessary to have adhesion strength with the aforementioned sintered silver bonding layer 4, is only the bonding surface PB to be bonded with the power semiconductor element 1, the electrode on the surface to be bonded with the power semiconductor element 1 may only be formed by plating. However, in Embodiment 1, the copper plating electrode 23 is provided on both surfaces of the circuit substrate 2, and thus, when the base plate 3 (may be a heat block, instead) is bonded at the side opposite to the side toward the power semiconductor element 1 as shown in FIG. 1, its adhesion strength can also be enhanced. Further, although it is desirable that the copper plating electrode 23 be made of pure copper, its alloy may instead be used that includes a small additive of another element or the like. Further, in this embodiment, a predetermined hardness (70 HV or more, for example) is attained by forming the electrode by plating; however, the electrode may be formed other than by plating so far as the predetermined hardness is attained.

As described above, the circuit substrate 2 according to Embodiment 1 is such a circuit substrate 2 having the bonding surface PB to be bonded to the power semiconductor element 1 using the sinterable silver-particle bonding material 4P (or, via the sintered silver bonding layer 4). The circuit substrate is configured to include the insulative substrate 21, and the copper plating electrode 23a which is an electrode placed on one surface of the insulative substrate 21 and formed with the bonding surface PB facing toward the same side of the substrate as that of said one surface, wherein the copper plating electrode 23a has a thickness of 150 μm or more and a Vickers hardness of 70 HV or more. Thus, it is possible to ensure, flow of a large current necessary for the operation of the power semiconductor element 1, and transfer of the heat generated due to the operation; and is also possible to suppress a grain boundary sliding at the interface portion between the copper plating electrode 23a and the sintered silver bonding layer 4 to thereby keep bonding state of the power semiconductor element 1 and the circuit substrate 2 over a long period, even operating at a high temperature.

It is noted that, a hardness of 100 HV or more ensures a margin, so that a strong bonding is surely achieved even manufacturing variation occurs.

Further, since the electrode is formed by copper plating, the hardness of the electrode can easily be adjusted to a predetermined value or more.

Further, the method for fabricating the circuit substrate 2 according to Embodiment 1 includes: a step of forming a sputtered copper film as the metal thin film 22a by sputtering on a given area (pattern) of at least one surface (surface at the side to be bonded with the power semiconductor element 1) of the insulative substrate 21; a step of forming the copper plating layer 23aC having a thickness of 150 μm or thicker on the metal thin film 22a; and a step of polishing the surface of the plating layer 23aC to develop the bonding surface PB to be bonded with the power semiconductor element 1. Thus, it is possible to easily form an electrode having an intended thickness and retaining a predetermined hardness.

Further, the power semiconductor device according to Embodiment 1 is configured to include the circuit substrate 2 as aforementioned, and the power semiconductor element 1 which is bonded with the bonding surface PB of the electrode (copper plate electrode 23a) of the circuit substrate 2 via the sinterable silver-particle bonding material 4P. Thus, it is possible achieve a power semiconductor device which can ensure, flow of a large current necessary for the operation of the power semiconductor element 1, and transfer of the heat generated due to the operation; and which can also suppress a grain boundary sliding at the interface portion between the copper plating electrode 23a and the sintered silver bonding layer 4 to thereby keep bonding state of the power semiconductor element 1 and the circuit substrate 2 over a long period, even operating at a high temperature.

Further, the method for fabricating the power semiconductor device according to Embodiment 1 includes: a step of applying the sinterable silver-particle bonding material 4P on a given area (pattern) of the bonding surface PB of the copper plating electrode 23a of the circuit substrate 2; a step of mounting the power semiconductor element 1 on the surface of the applied sinterable silver-particle bonding material 4P; and a step of sintering the silver particles in the sinterable silver-particle bonding material 4P at a temperature lower than the annealing temperature of the electrode (copper plating electrode 23a) to thereby bond the power semiconductor element 1 with the circuit substrate 2. Thus, it is possible to achieve a power semiconductor device which can retain the hardness of the copper plating electrode 23a to suppress a brain boundary sliding at the interface portion, to thereby keep bonding state of the power semiconductor element 1 and the circuit substrate 2 over a long period.

Embodiment 2

In Embodiment 1, the electrode to be bonded with the power semiconductor element is described for the case where all portions of its thickness are formed by plating. In Embodiment 2, a thickness of its portion required to retain the hardness is determined, and the thus-required thickness portion from the bonding surface PB to be bonded with the semiconductor element to a given depth, is formed by plating, and its portion at the side toward the insulative substrate is formed of a copper plate (by brazing) whose hardness is not limited. The other configuration is the same as that in Embodiment 1.

Figure 6:
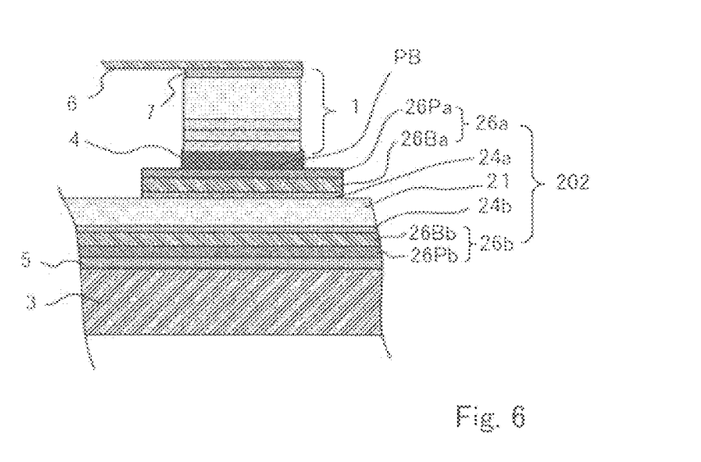
FIG. 6 is a partial cross-sectional view for illustrating a configuration of a power semiconductor device according to Embodiment 2 of the invention.

FIG. 6 is for illustrating a power semiconductor device and a circuit substrate according to Embodiment 2 of the invention, and is a partial cross-sectional view of the power semiconductor device. The power semiconductor device according to Embodiment 2 has a difference relative to Embodiment 1 only in the configuration of a circuit substrate 202, so that descriptions of the power semiconductor element 1 and the silver nanopaste 4P for forming the sintered silver bonding layer 4, and general description of the power semiconductor device, are omitted here.

<Circuit Substrate>

The circuit substrate 202, which is an electrode-attached insulative substrate, is configured by bonding copper plates 26Ba,26Bb as underlying layers (collectively referred to as an underlying copper plate 26B) each having a thickness of 500

μm, respectively on both surfaces of an insulative substrate (silicon nitride) 21, using brazing materials 24a,24b (collectively referred to as a brazing material 24), followed by forming copper plating layers 26Pa,26Pb (collectively referred to as a copper plating layer 26P) each having a thickness of 50 μm or more on the underlying copper plate 26B. Namely, copper electrodes 26a,26b (collectively referred to as a copper electrode 26) which are formed on both surfaces of the circuit substrate 202, are configured with the underlying copper plate 26B whose hardness is not specified and the copper plating layer 26P having a hardness of a predetermined value or more (70 HV) formed into a predetermined thickness or more on the underlying copper plate.

When the thickness of the copper plating layer 26P (exactly, the thickness of the layer having a hardness of 70 HV or more, at the side of the bonding surface PB to be bonded with the power semiconductor element 1) is given as 50 μm or more, it is possible, irrespective of the hardness of the underlying copper plate 26B, to suppress a grain boundary sliding at the interface with the sintered silver bonding layer 4 so as to prevent a vertical crack from occurring, to thereby enhance the adhesion strength. Namely, when the thickness of the copper plating layer 26P is given as 50 μm or more, it is possible to eliminate the influence of the crystalline brittleness of the underlying copper plate 26B to the bonding surface PB, to thereby retain a higher bonding strength. Also, when the thickness of the copper plating layer 26P is given as 100 μm or more, the reliability can be further enhanced. In the preferable range of thickness as the copper electrode, its lower limit is 150 μm as similar to in Embodiment 1; however, its upper limit may be higher by the value corresponding to the thickness of the underlying copper plate 26B. Note that the thickness of the copper plating layer 26P may be larger than the thickness of the underlying copper plate 26B.

A method for fabricating the circuit substrate 202 will be described. The underlying copper plates 26Ba,26Bb each having a size of 18 mm square and a thickness of 500 μm, are bonded respectively with both surfaces of the insulative substrate 21 having a size of 20 mm square, a thickness of 1.0 mm and made of silicon nitride, using a silver solder at a bonding temperature of 700° C. Then, on the underlying copper plate 26B thus bonded, the copper plating layer 26P having a thickness of 50 μm is formed.

The thickness of the copper electrode 26 (exactly, the thickness as the conductive member) is preferably in a range from 150 μm to more. By ensuring the thickness of the copper electrode 26 to be 150 μm or more, it is possible to dissipate efficiently heat generated due to the large current. Further, as described later, in the copper electrode 26, the copper plating layer 26P formed at the side of the bonding surface PB to be bonded with the power semiconductor element 1 is required to ensure a thickness of 50 μm or more as the portion retaining a hardness of 70 HV or more. Note that in Embodiment 2, since almost all of the thickness required for the copper electrode 26 is gained by the underlying copper plate 26B, it is sufficient that the thickness of the copper plating layer 26P be around 50 μm. Therefore, the surface of the copper electrode 26 just after the plating surely has a sufficient surface accuracy in order to bond it with the power semiconductor element 1, so that it is not necessary to polish it to establish the surface accuracy as in Embodiment 1. In Embodiment 2, it is also noted that, although the hardness of 70 HV or more of the copper plating layer 26P is sufficient in actual effect, it is desirable to have a margin to thereby keep the hardness to be 100 HV or more from the viewpoint of the fabrication accuracy.

Like Embodiment 1, as the plating bath for forming the copper plating layer 26P, the high-throw bath composed of copper sulfate and sulfuric acid and having a PH of 1.0 was used. Then, using the DC power source (Hokuto Denko Corporation; Electrochemical Measurement System HZ-5000), the copper plating layer 26P was formed by a constant-current electrolysis under a condition with a current density of 1.0 A/dm$^2$ and a bath temperature of 25° C. Note that it is desirable to add to the plating solution a hardening agent, such as a thiourea derivative, in order to enhance the hardness of the copper plating layer 26P. Not only the above-described plating bath that achieves a hardness of 70 HV or more, but also a plating bath of copper pyrophosphate, copper borofluoride and/or copper cyanide may be used.

A method for bonding the power semiconductor element 1 with the circuit substrate 202 formed as described above is similar to in Embodiment 1, and will be described using FIG. 3 with the names and numerals replaced to read.

As shown at FIG. 3(a), on the surface of the copper electrode 26a, using a stainless mask M4 having an opening $O_{M4}$ of 6 mm square and a thickness of 0.2 mm, a silver nanopaste 4P was printed in the portion within the opening $O_{M4}$. Then, as shown at FIG. 3(b), the power semiconductor element 1 was positioned with and mounted on the surface of thus-printed silver nanopaste 4P, to provide a provisional bonded product. Subsequently, the provisional bonded product was subjected to a pre-heat treatment at 100° C. for 10 minutes, and was then heated to 350° C. while being pressed at 5 MPa. After reaching 350° C., the product was retained for 5 minutes, so that the organic substance having covered the silver nanoparticles (fine particles) included in the silver nanopaste was decomposed, and the fine particles thus-exposed were sintered together, to thereby form the sintered silver bonding layer 4 as shown at FIG. 3(b). Then, it was air-cooled, to thereby achieve a bonded product of the circuit substrate 202 and the power semiconductor element 1. Thereafter, by further bonding the base plate 3 and the lead plate 6 with the product as previously-mentioned, it is possible to achieve the power semiconductor device as shown in FIG. 6. As the silver nanopaste 4P, T2W-A2 made by DOWA corporation may be used, for example. The above heat-bonding was carried out using a bonding apparatus (Athlete FA Corporation; thermal compression bonding unit).

Next, in order to evaluate bonding reliability between the power semiconductor element 1 and the circuit substrate 202 in the power semiconductor device according to Embodiment 2 of the invention, a comparative test of adhesion strength was conducted using samples (Example) of the bonded products according to this embodiment and other samples (Comparative Example) of the bonded products corresponding to a conventional circuit substrate.

<Samples>

The samples (bonded products) of Comparative Example were similar to those of Comparative Example in Embodiment 1, and used as the circuit substrate was an insulative substrate 21 having a size of 20 mm square and a thickness of 1.0 mm, made of silicon nitride, and provided with copper plates 25 each having a size of 18 mm square and a thickness of 500 μm which were bonded by a brazing material 24 respectively with both surfaces of the insulative substrate 21. The bonding method (fabrication method of a bonded product) was similar to that in Embodiments 1 and 2. Herein prepared respectively were three samples for Example (SE2-1 to SE2-3), and three samples for Comparative Example (SC2-1 to SC2-3).

<Comparative Test of Adhesion Strength>

Like the comparative test of adhesion strength in Embodiment 1, the samples of bonded products thus-configured were put in the heat-shock tester (ESPEC Corporation: Thermal Shock Chamber TSA-101S-W) and then placed in the treatment condition of from −40 C.° to 200° C. (one cycle comprises keeping −40 C.° for 30 minutes and 200 C.° for 30 minutes). For every 200 cycles, the adhesion strengths were measured by the share tester (Dage Corporation: Share Tester HS4000). Likewise, in evaluating the adhesion strengths, it was determined as "no adhesion defect" if no peel-off occurred even when 30 Kgf/chip or more was applied, and determined as "reduction in strength" if peel-off occurred when less than 30 Kgf/chip was applied. Note that each surface hardness of the copper electrode 26a as Example and the copper plate electrode 25a as Comparative Example, was measured using the Vickers hardness tester (Mitutoyo Corporation: MVK-H2), under a condition with a measuring load of 100 g and a measuring time of 10 seconds. Before the bonding, the hardness of the copper electrode 26 of each sample of Example was 70 HV, whereas the hardness of the copper plate electrode 25a of each sample of Comparative Example was 30 HV.

In Table 2, the result of the comparative test of adhesion strength is shown, in which "o" represents "no adhesion defect" and "X" represents "reduction in strength".

TABLE 2

| Sample | | Spec | Adhesion Strength passing cycles without adhesion defect | | | | | |
|---|---|---|---|---|---|---|---|---|
| | | | 0 | 200 | 400 | 600 | 800 | 1000 |
| Comparative Example | SC2-1 | Copper Plate Electrode | ○ | X | X | X | X | X |
| | SC2-2 | Copper Plate Electrode | ○ | ○ | X | X | X | X |
| | SC2-3 | Copper Plate Electrode | ○ | ○ | X | X | X | X |
| Example | SE2-1 | Surface Copper Plating | ○ | ○ | ○ | ○ | ○ | ○ |
| | SE2-2 | Surface Copper Plating | ○ | ○ | ○ | ○ | ○ | ○ |
| | SE2-3 | Surface Copper Plating | ○ | ○ | ○ | ○ | ○ | ○ |

As shown in Table 2, in the samples each having the copper plating layer 26P of this Example, even after passing 1000 cycles, there is no occurrence of adhesion defect, so that reduction in adhesion strength is not found. In contrast, in the samples each having the brazed copper plate electrode 25a of Comparative Example, it is confirmed that adhesion defect occurred before 400 cycles, so that the adhesion strength becomes reduced.

Like Embodiment 1, in order to compare the states of the samples of Example and the samples of Comparative Example after the comparative test of adhesion strength, their respective cross-sections were observed using the SEM (Scanning Electron Microscope (JEOL Ltd.: JXA-8530F)). As a result, also in Embodiment 2, in the copper electrode 26, no grain boundary sliding was found at the bonding surface PB of the copper plating layer 26P bonded with the power semiconductor element 1, and also no vertical crack was found in the sintered silver bonding layer 4 serving as the bonding part. In contrast, according to the observation of the cross-sections of the bonded samples of Comparative Example that showed reduction in adhesion strength after passing 400 cycles, a grain boundary sliding was found at the bonding surface PB of the copper plate electrode 25a bonded with the power semiconductor element 1, and a vertical crack CV was found developed in the sintered silver bonding layer 4 beginning at the grain boundary sliding portion.

Next, in order to investigate a lower limit of thickness of the portion having a hardness of a predetermined value (70 HV) or more, samples were prepared each with the copper plating layer 26P whose thickness was given as a parameter, which were then subjected to a heat shock test, like the comparative test of adhesion strength as previously mentioned, to thereby find out each number of cycles in which the adhesion strength had been retained.

In the samples (bonded products), the circuit substrates were each configured by bonding the copper plate 26B as underlying copper layers each having a size of 18 mm square and a thickness of 500 μm, with both surfaces of the insulative substrate 21 having a size of 20 mm square and a thickness of 1.0 mm and made of silicon nitride, using the brazing material 24; followed by forming on the copper plate, each of the copper plating layers 26P having various thicknesses. The bonding method (fabrication method of a bonded product) was similar to that in Embodiments 1 and 2. As the samples with the different thicknesses, prepared here were respective three samples for each of eight types including: types SPT1 to SPT3 with plating thicknesses of 25 μm, 40 μm and 45 μm, respectively, which correspond to Comparative Example; and types SPT 4 to SPT 8 with plating thicknesses of 50 μm, 55 μm, 60 μm, 100 μm and 150 μm, respectively, which correspond to Example. The Vickers hardness of each copper plating layer 26P portion of the samples was adjusted to 70 HV.

In Table 3, the result of the comparative test of adhesion strength is shown, in which "o" represents "no adhesion defect" and "X" represents "reduction in strength".

[Table 3]

TABLE 3

| Sample | | Plating Thickness | Adhesion Strength passing cycles without adhesion defect | | | | | | | |
|---|---|---|---|---|---|---|---|---|---|---|
| | | | 0 | 200 | 400 | 600 | 800 | 1000 | 1500 | 2000 |
| Comparative Example | SPT-1 | 25 μm | ○ | ○ | ○ | ○ | X | X | X | X |
| | SPT-2 | 40 μm | ○ | ○ | ○ | ○ | ○ | X | X | X |
| | SPT-3 | 45 μm | ○ | ○ | ○ | ○ | ○ | ○ | ○ | X |
| Example | SPT-4 | 50 μm | ○ | ○ | ○ | ○ | ○ | ○ | ○ | ○ |
| | SPT-5 | 55 μm | ○ | ○ | ○ | ○ | ○ | ○ | ○ | ○ |
| | SPT-6 | 60 μm | ○ | ○ | ○ | ○ | ○ | ○ | ○ | ○ |
| | SPT-7 | 100 μm | ○ | ○ | ○ | ○ | ○ | ○ | ○ | ○ |
| | SPT-8 | 150 μm | ○ | ○ | ○ | ○ | ○ | ○ | ○ | ○ |

As shown in Table 3, the thicker the thickness of the copper plating layer 26P is made, the larger the number of cycles during which the adhesion strength is retained becomes. Further, it is found that when the thickness of the copper plating layer 26P is given as 50 μm or more, the strength is sufficiently retained even after 2000 cycles. In contrast, it is found that when the thickness is less than 50 μm, the number of cycles causing a defect in adhesion strength becomes smaller as the thickness becomes thinner, and also a variation in test results is likely to occur, resulting in bonding ability getting unstable.

As described above, the circuit substrate 202 according to Embodiment 2 is such a circuit substrate 202 having the bonding surface PB to be bonded to the power semiconductor element 1 using the sinterable silver-particle bonding material 4P (or, via the sintered silver bonding layer 4). The circuit substrate is configured to include the insulative substrate 21, and the copper electrode 26a which is an electrode placed on one surface (surface at the side to be bonded with the power semiconductor element 1) of the insulative substrate 21 and formed with the bonding surface PB facing toward the same side of the substrate as that of said one surface, wherein the copper electrode 26a has a thickness of 150 μm or more, and the copper plating layer 26P, which corresponds to a portion in the above thickness from the bonding surface PB with the power semiconductor element 1 toward the insulative substrate 21 up to at least a depth of 50 μm, has a Vickers hardness of 70 HV or more. Thus, it is possible to ensure, flow of a large current necessary for the operation of the power semiconductor element 1, and transfer of the heat generated due to the operation; and is also possible to suppress a grain boundary sliding at the interface portion between the copper electrode 26a and the sintered silver bonding layer 4 to thereby keep bonding state of the power semiconductor element 1 and the circuit substrate 202 over a long period, even operating at a high temperature.

Further, according to Embodiment 2, it is also possible to achieve a power semiconductor device with a high bonding reliability as similar to Embodiment 1.

Further, the method for fabricating the circuit substrate 202 according to Embodiment 2 is designed to include: a step of bonding a given shape of the copper plate 26Ba having a thickness of 100 μm or more as the underlying of copper, with at least one surface of the insulative substrate 21, said one surface being the surface at the side to be bonded with the power semiconductor element 1; and a step of plating copper up to a thickness of 50 μm or more on the surface of the bonded copper plate 26Ba, namely forming the copper plating layer 26P, to develop the bonding surface PB (or the electrode 26a having this surface) to be bonded with the power semiconductor element 1. Thus, it is possible to easily form the copper electrode 26a having an intended thickness and retaining a predetermined hardness in its region corresponding to a portion of the intended thickness from the bonding surface PB to a necessary depth.

Further, since the portion corresponding to a thickness of 50 μm or more at the side of the bonding surface PB is formed by plating, it is possible to easily adjust to a predetermined value or more, the hardness of the portion from the bonding surface PB toward the insulative substrate 21 up to at least a depth of 50 μm. In addition, since the thickness of the copper plating electrode 26Pa is set to around 50 μm, it is possible to ensure a surface accuracy required to the bonding surface PB, easily without a mechanical polishing (or cutting). However, as a matter of course, this does not mean to preclude polishing of the copper plating layer 26Pa for further enhancing the surface accuracy.

Embodiment 3

It is noted that, according to the copper electrode 26a of Embodiment 2, since the copper plate 26Ba at its side toward the insulative substrate 21 has been annealed under brazing processing, its hardness is lower than the hardness of the copper plating layer 26Pa at the side toward the power semiconductor element 1. In this manner, the copper electrode 26a may have a hardness distribution in depth direction so that the hardness of at the side toward the insulative substrate 21 is made lower. For example, in the case where the hardness is made uniform over all regions in thickness direction and thus the hardness at its side toward the insulative substrate 21 is given highly, a crack occurs in the ceramic portion of the insulative substrate 21 in some cases if a thermal shock is applied thereto. In contrast, as the copper electrode 26a in Embodiment 2, when the electrode whose hardness is lower at its side toward the insulative substrate 21 than at its side toward the power semiconductor element 1 is used, it is found that occurrence of crack becomes reduced. Thus, it is considered that stress relaxation occurs in the lower hardness portions.

Accordingly, in a power semiconductor device according to Embodiment 3, the copper electrode of the circuit substrate 2 is so configured that the hardness at its side toward the insulative substrate 21 is lower than the hardness at its side toward the bonding surface PB with the power semiconductor element 1. Then, in order to study an effect by such a power semiconductor device according to Embodiment 3, the following evaluation was conducted.

For exactly recreating a hardness at the side toward the insulative substrate 21, a thickness of the portion having this hardness and the like, an electrode structure similar to that shown in Embodiment 1 was applied, so that the evaluation was conducted using as parameters, a hardness and a thickness of the sputtered film 22a as the electrode member at the side toward the insulative substrate 21, and a hardness and a thickness of the copper plating electrode 23a as the electrode member at the side toward the power semiconductor element 1. Namely, the evaluation was conducted for the structure of copper plating electrode 23a/sputtered film 22a/SiN (insulative substrate) 21/sputtered film 22b/copper plating electrode.

Samples of bonded products were prepared similarly to Examples in Embodiments 1 and 2, in which the thickness of each of the sputtered films 22a as the electrode member at the side toward the insulative substrate 21 was given as 10 μm; and the Vickers hardness (30, 40, 50, 60, 70 HV) of the sputtered films, and the thickness (50, 100, 200 μm) and hardness (70, 80, 90, 100 HV) of the copper plating electrodes were given as parameters. The thus-configured samples of bonded products were treated under a condition of from −40° C. to 200° C. (one cycle comprises keeping −40 C.° for 30 minutes and 200 C.° for 30 minutes) for 1000 cycles, and then, whether or not a crack occurred in SiN being a ceramic, was confirmed. The results of this test are shown in Table 4, in which "o" represents "no occurrence of crack" and "X" represents "occurrence of crack".

TABLE 4

| | | | | insulative substrate side member Sputtered Film Thickness: 10 μm Vickers hardness | | | | |
|---|---|---|---|---|---|---|---|---|
| | | | | 30HV | 40HV | 50HV | 60HV | 70HV |
| semiconductor element side member Copper Plating Layer | Thickness | 50 μm Vickers hardness | 70HV | ○ | ○ | ○ | X | X |
| | | | 80HV | ○ | ○ | ○ | X | X |
| | | | 90HV | ○ | ○ | ○ | X | X |
| | | | 100HV | ○ | ○ | ○ | X | X |
| | | 100 μm Vickers hardness | 70HV | ○ | ○ | ○ | X | X |
| | | | 100HV | ○ | ○ | ○ | X | X |
| | | 200 μm Vickers hardness | 70HV | ○ | ○ | ○ | X | X |
| | | | 100HV | ○ | ○ | ○ | X | X |

As shown in Table 4, it is confirmed that in the samples whose each sputtered film 22a has a Vickers hardness of 30 to 50 HV, no crack occurs irrespective of the thickness and the hardness of the copper plating electrode 23a (in the table, indicated as "copper plating layer" as one layer in the electrode) at the side toward the power semiconductor element 1. On the other hand, in the samples with 60 HV or more, occurrence of crack is found. Namely, it is considered that when the hardness of the electrode member at the side toward the insulative substrate 21 is made to be 50 HV or less, stress generated during the heat cycles between the insulative substrate 21 and the electrode is relaxed, so that a crack is prevented from occurring. Meanwhile, the similar test was conducted for the sputtered film decreased in thickness up to 5 μm, the result of which is shown in Table 5.

TABLE 5

Results of adhesion strength evaluartion using as parameter, hardness of copper electrode at insulative substrate side A2

| | | | | | insulative substrate side member Sputtered Film Thickness: 5 μm Vickers hardness | | | | |
|---|---|---|---|---|---|---|---|---|---|
| | | | | | 30HV | 40HV | 50HV | 60HV | 70HV |
| semiconductor element side member Copper Plating Layer | Thickness | 50 μm | Vickers hardness | 70HV | ○ | ○ | ○ | X | X |

A shown in Table 5, it is found that, even if the thickness of the sputtered film 22a is decreased to 5 μm, namely, the thickness of the lower-hardness portion is decreased up to 5 μm, a crack can be prevented from occurring by reducing its Vickers hardness to 50 HV or less. It is further confirmed that when the thickness of the sputtered film 22a is decreased to less than the above, although such a hardness can not exactly measured, an effect to prevent occurrence of crack is achieved.

According to the evaluation of adhesion strength further conducted for the above samples, it was confirmed that the adhesion strength can be retained when the hardness in its region from the bonding surface PB up to at least a depth of 50 μm is made to be 70 HV or more, and the hardness at its side toward the insulative substrate 21 is made to be 50 HV or less, even if the whole thickness of the electrode is 150 μm or less. Namely, it was found that, when the hardness in the region from the bonding surface PB to a depth of 50 μm is made to be 70 HV or more, and the hardness at the side toward the insulative substrate 21 is made to be 50 HV or less, it becomes possible to prevent occurrence of crack to thereby retain the adhesion strength, irrespective of the thickness of the layered electrode.

It is noted that, Embodiment 3 is resulted from the evaluation test which has been conducted, using the sputtered film 22a whose hardness is easily adjustable, on the basis of the finding that the hardness of the copper plate 26B became decreased as a specific phenomenon due to the configuration of Embodiment 2 as aforementioned, so as to study an effect by the phenomenon. Thus, as a matter of course, it is possible to achieve the effect as described above by the configuration of Embodiment 2 if the hardness in the region from the bonding surface PB to a depth of 50 μm (26P) is made to be 70 HV or more, and the hardness at the side toward the insulative substrate 21 (26B) is actively made to be 50 HV or less.

Embodiment 4

Meanwhile, even by the configuration of Embodiment 1, it must be achieved a similar effect if a layer at the side toward the insulative substrate 21 is formed with a plating condition that makes the hardness lower, and a layer at the side toward the power semiconductor element 1 is formed with a plating condition that makes the hardness higher by use of, for example, a plating solution to which a hardening agent is added.

Thus, in order to study an effect by a power semiconductor device according to Embodiment 4, the following evaluation was conducted.

Samples of bonded products were prepared similarly to Examples in Embodiments 1 and 2, in which the Vickers hardness (30, 40, 50, 60, 70 HV) of the copper plating layer having a thickness of 100 μm as the electrode member at the side toward the insulative substrate 21, and the thickness (50, 100 μm) and hardness (70, 80, 90, 100 HV) of the copper plating layer at the side toward the power semiconductor element 1, were given as parameters. The thus-configured samples of bonded products were treated under a condition of from −40° C. to 200° C. (one cycle comprises keeping −40 C.° for 30 minutes and 200 C.° for 30 minutes) for 1000 cycles, and then, whether or not a crack occurred in SiN being a ceramic, was confirmed. The results of this test are shown in Table 6, in which "o" represents "no occurrence of crack" and "X" represents "occurrence of crack".

TABLE 6

Results of adhesion strength evaluartion using as parameter, hardness of copper electrode at insulative substrate side B1

| | | | | insulative substrate side member/Copper Plating Layer(underlying) Thickness: 100 μm Vickers hardness | | | | |
|---|---|---|---|---|---|---|---|---|
| | | | | 30HV | 40HV | 50HV | 60HV | 70HV |
| semiconductor element side member/ Copper Plating Layer (Upper layer) | Thickness | 50 μm | Vickers hardness | | | | | |
| | | | 70HV | ○ | ○ | ○ | X | X |
| | | | 80HV | ○ | ○ | ○ | X | X |
| | | | 90HV | ○ | ○ | ○ | X | X |
| | | | 100HV | ○ | ○ | ○ | X | X |
| | | 100 μm | Vickers hardness | | | | | |
| | | | 70HV | ○ | ○ | | | |

As shown in Table 6, it is confirmed that in the samples whose each copper plating layer at the side toward the insulative substrate 21 has a Vickers hardness of 30 to 50 HV, no crack occurs irrespective of the thickness and the hardness of the copper plating layer at the side toward the power semiconductor element 1. On the other hand, in the samples with 60 HV or more, occurrence of crack is found. Namely, it is considered that when the hardness of the electrode member at the side toward the insulative substrate 21 is made to be 50 HV or less, stress generated during the heat cycles between the insulative substrate 21 and the electrode is relaxed, so that a crack is prevented from occurring. Meanwhile, the similar test was conducted for the cases where the thickness of the copper plating layer at the side toward the insulative substrate 21 is made to be 200 μm and 300 μm, the results of which are shown in Table 7 and Table 8.

A shown in Table 7 and Table 8, it is found that, even if the thickness of the copper plating layer at the side toward the insulative substrate 21 is increased to 200 μm or 300 μm, namely, the thickness of the lower-hardness portion is increased up to 300 μm, a crack can be prevented from occurring by reducing its Vickers hardness to 50 HV or less. Thus, combining this results with the evaluation result in Embodiment 3 reveals that a crack can be prevented from occurring by reducing the Vickers hardness of the lower-hardness portion to 50 HV or less, irrespective of its thickness.

As described above, the semiconductor devices according to Embodiments 1-4 are each configured to include: the circuit substrate 2 configured with the insulative substrate 21 which is formed of a ceramic material and is provided on its one surface with an electrode (a combination of 22, 23 and 26, for example) formed of a copper material; and the power semiconductor element 1 as a semiconductor element bonded to the electrode using a sinterable silver-particle bonding material 4P; wherein the electrode has a Vickers hardness of 70 HV or more in its portion (for example, 23, 26P or a layer in 26P, which is formed to be higher in hardness) from the

TABLE 7

Results of adhesion strength evaluartion using as parameter, hardness of copper electrode at insulattve substrate side B2

| | | | | insulative substrate side member/Copper Plating Layer(underlying) Thickness: 200 μm Vickers hardness | | | | |
|---|---|---|---|---|---|---|---|---|
| | | | | 30HV | 40HV | 50HV | 60HV | 70HV |
| semiconductor element side member/Copper Plating Layer (Upper layer) | Thickness | 50 μm | Vickers hardness | | | | | |
| | | | 70HV | ○ | ○ | ○ | X | X |
| | | | 80HV | ○ | ○ | ○ | X | X |
| | | | 100HV | ○ | ○ | ○ | X | X |

TABLE 8

Results of adhesion strength evaluartion using as parameter, hardness of copper electrode at insulative substrate side B3

| | | | | insulative substrate side member/Copper Plating Layer(underlying) Thickness: 300 μm Vickers hardness | | | | |
|---|---|---|---|---|---|---|---|---|
| | | | | 30HV | 40HV | 50HV | 60HV | 70HV |
| semiconductor element side member/Copper Plating Layer (Upper layer) | Thickness | 50 μm | Vickers hardness | | | | | |
| | | | 70HV | ○ | ○ | ○ | X | X |
| | | | 80HV | ○ | ○ | ○ | X | X |
| | | | 100HV | ○ | ○ | ○ | X | X | bonding surface PB with the power semiconductor element 1 toward the insulative substrate 21 to a depth of 50 μm, and has a Vickers hardness of 50 HV or less in its another portion (for example, 22, 26B and a layer in 26P, which is formed to be lower in hardness) at the side toward the insulative substrate 21. Thus, it is possible to achieve a power semiconductor device which can prevent occurrence of crack and retain the adhesion ability, to thereby keep bonding state of the power semiconductor element 1 and the circuit substrate 2 over a long period, even operating at a high temperature.

Further, the fabrication methods of the semiconductor devices according to Embodiments 1 and 4 are each designed to include: a step of forming the metal thin film 22 by sputtering on a given area of at least one surface of the insulative substrate 21 formed of a ceramic material;

a step of forming a first copper plating layer so as to have a Vickers hardness of 50 HV or less, on the metal thin film 22; a step of forming a second copper plating layer so as to have a thickness of 50 μm or more and a Vickers hardness of 70 HV or more, on the first copper plating layer, to thereby develop an electrode having a bonding surface PB to be bonded with a semiconductor element; and a step of bonding the power semiconductor element 1 as the semiconductor element with the bonding surface of the electrode using the sinterable silver-particle bonding material 4P. Thus, the semiconductor devices as described above can be fabricated easily.

Further, the fabrication methods of the semiconductor devices according to Embodiments 2 and 3 are each designed to include: a step of bonding the copper plate 26B having a given shape with at least one surface of the insulative substrate 21 formed of a ceramic material so that at least a portion of the copper plate at the side toward the insulative substrate has a Vickers hardness of 50 HV or less after the bonding; a step of plating copper on a surface of the copperplate 26B bonded with the insulative substrate 21, to thereby develop the electrode 26 having a bonding surface PB to be bonded with a semiconductor element and having a Vickers hardness of 70 HV or more to a depth of 50 μm or more; and a step of bonding the power semiconductor element 1 as the semiconductor element with the bonding surface PB of the electrode 26 using the sinterable silver-particle bonding material 4P. Thus, the semiconductor devices as described above can be fabricated easily.

It is noted that, although the respective embodiments are described for the case of using IGBT as the switching element, MOSFET (Metal-Oxide-Semiconductor Field-Effect-Transistor) may be used instead. Further, as a material of the wide bandgap semiconductor element, a material such as gallium nitride (GaN), gallium arsenide or diamond may be used other than silicon nitride.

Further, in the respective embodiments, the power semiconductor element 1 serving as a rectifier element (diode) or a switching element (transistor) is exemplified as a so-called wide bandgap semiconductor element formed of silicon carbide; however, it is not limited thereto and may be that formed of silicon (Si). But, when silicon carbide, a gallium nitride family material, gallium arsenide or diamond which can form a so-called wide bandgap semiconductor whose bandgap is larger than silicon as aforementioned, is used, a range of the operable temperature becomes higher so that the effect exerted by the invention can be more enhanced.

DESCRIPTION OF REFERENCE NUMERALS AND SIGNS

1: power semiconductor element (semiconductor element),
2: circuit substrate (electrode-attached insulative substrate)
3: base plate,
4: sintered metal bonding layer,
4P: sinterable silver-particle bonding material (silver nanopaste),
5: bonding material (solder),
6: lead (wiring member),
7: bonding material (solder),
11: semiconductor chip (semiconductor substrate)
12: metal silicide,
13: first metal layer,
14: second metal layer,
21: insulative substrate,
22: sputtered film (metal thin film),
23: copper plating electrode (electrode),
24: bonding material (brazing material)
26: copper electrode (26B: underlying copper plate, 26P: copper plating layer),
PB: bonding surface.
(hundreds place digit represents a embodiments difference)

The invention claimed is:

1. A semiconductor device comprising:
a circuit substrate which comprises an insulative substrate formed of a ceramic material and provided on its one surface with an electrode formed of a copper material;
a semiconductor element bonded with the electrode using a sinterable silver-particle bonding material; and
a first surface of the electrode is attached to the insulative substrate and a second surface of the electrode is attached to bonding material toward the semiconductor element,
wherein the electrode has a Vickers hardness of 70 HV or more in its portion from a bonding surface as the second surface with the semiconductor element toward the insulative substrate to a depth of 50 μm, and has a Vickers hardness of 50 HV or less in its another portion at the side as the first surface toward the insulative substrate.

2. The semiconductor device of claim 1, wherein the portion from the bonding surface with the semiconductor element toward the insulative substrate to the depth of 50 μm, has a Vickers hardness of 100 HV or more.

3. The semiconductor device of claim 2, wherein the portion from the bonding surface with the semiconductor element toward the insulative substrate to the depth of 50 μm, is formed by plating.

4. The semiconductor device of claim 3, wherein the semiconductor element is a power semiconductor element, and the electrode has a thickness of 150 μm or more.

5. The semiconductor device of claim 4, wherein the power semiconductor element is formed of a wide bandgap semiconductor material.

6. The semiconductor device of claim 5, wherein the wide bandgap semiconductor material is one of materials consisting of silicon carbide, a gallium nitride family material, gallium arsenide and diamond.

7. The semiconductor device of claim 2, wherein the semiconductor element is a power semiconductor element, and the electrode has a thickness of 150 μm or more.

8. The semiconductor device of claim 7, wherein the power semiconductor element is formed of a wide bandgap semiconductor material.

9. The semiconductor device of claim 8, wherein the wide bandgap semiconductor material is one of materials consisting of silicon carbide, a gallium nitride family material, gallium arsenide and diamond.

10. The semiconductor device of claim 1, wherein the portion from the bonding surface with the semiconductor element toward the insulative substrate to the depth of 50 μm, is formed by plating.

11. The semiconductor device of claim 10, wherein the semiconductor element is a power semiconductor element, and the electrode has a thickness of 150 μm or more.

12. The semiconductor device of claim 11, wherein the power semiconductor element is formed of a wide bandgap semiconductor material.

13. The semiconductor device of claim 12, wherein the wide bandgap semiconductor material is one of materials consisting of silicon carbide, a gallium nitride family material, gallium arsenide and diamond.

14. The semiconductor device of claim 1, wherein the semiconductor element is a power semiconductor element, and the electrode has a thickness of 150 μm or more.

15. The semiconductor device of claim 14, wherein the power semiconductor element is formed of a wide bandgap semiconductor material.

16. The semiconductor device of claim 15, wherein the wide bandgap semiconductor material is one of materials consisting of silicon carbide, a gallium nitride family material, gallium arsenide and diamond.

17. A process for fabricating a semiconductor device, comprising:
   a step of forming a metal thin film by sputtering on a given area of at least one surface of an insulative substrate formed of a ceramic material;
   a step of forming a first copper plating layer so as to have a Vickers hardness of 50 HV or less, on the metal thin film;
   a step of forming a second copper plating layer so as to have a thickness of 50 μm or more and a Vickers hardness of 70 HV or more, on the first copper plating layer, to thereby develop an electrode having a bonding surface to be bonded with a semiconductor element; and
   a step of bonding the semiconductor element with the bonding surface of the electrode using a sinterable silver-particle bonding material.

18. The process for fabricating a semiconductor device of claim 17, wherein the electrode developed has a thickness of 150 μm or more.

19. A process for fabricating a semiconductor device, comprising:
   a step of bonding a copper plate having a given shape with at least one surface of an insulative substrate formed of a ceramic material so that at least a portion of the copper plate at the side toward the insulative substrate has a Vickers hardness of 50 HV or less after the bonding;
   a step of plating copper on a surface of the copper plate bonded with the insulative substrate, to thereby develop an electrode having a bonding surface opposite to the side toward the insulative substrate to be bonded with a semiconductor element and having a Vickers hardness of 70 HV or more to a depth of 50 μm or more; and
   a step of bonding the semiconductor element with the bonding surface of the electrode using a sinterable silver-particle bonding material.

20. The process for fabricating a semiconductor device of claim 19, wherein the electrode developed has a thickness of 150 μm or more.

* * * * *